United States Patent
Shiratori et al.

(10) Patent No.: US 9,942,995 B2
(45) Date of Patent: Apr. 10, 2018

(54) METHOD FOR PRODUCING A METAL CORE SUBSTRATE HAVING IMPROVED EDGE INSULATING PROPERTIES

(71) Applicants: FURUKAWA ELECTRIC CO., LTD., Tokyo (JP); FURUKAWA AUTOMOTIVE SYSTEMS INC., Inukami-gun (JP)

(72) Inventors: Tomotsugu Shiratori, Inukami-gun (JP); Shinichi Jingama, Inukami-gun (JP)

(73) Assignees: FURUKAWA ELECTRIC CO., LTD., Tokyo (JP); FURUKAWA AUTOMOTIVE SYSTEMS INC., Inukami-gun (JP)

( * ) Notice: Subject to any disclaimer, the term of this patent is extended or adjusted under 35 U.S.C. 154(b) by 490 days.

(21) Appl. No.: 14/555,974

(22) Filed: Nov. 28, 2014

(65) Prior Publication Data
US 2015/0083472 A1 Mar. 26, 2015

Related U.S. Application Data (63) Continuation of application No. PCT/JP2013/064692, filed on May 28, 2013.

(30) Foreign Application Priority Data

May 30, 2012 (JP) ................... 2012-122854

(51) Int. Cl.
*H01K 3/10* (2006.01)
*H05K 3/44* (2006.01)
(Continued)

(52) U.S. Cl.
CPC ............... *H05K 3/445* (2013.01); *H05K 1/05* (2013.01); *H05K 1/056* (2013.01); *H05K 3/0052* (2013.01);
(Continued)

(58) Field of Classification Search
CPC ......... Y10T 29/49126; Y10T 29/49155; Y10T 29/49156; Y10T 29/49165; H05K 3/4608
(Continued)

(56) References Cited

U.S. PATENT DOCUMENTS

| 7,002,081 B2* | 2/2006 | Wang ................... H05K 1/0231 174/255 |
| 2007/0163109 A1* | 7/2007 | Takiar ................. H01L 21/4857 29/825 |
| 2012/0031883 A1 | 2/2012 | Kumamoto et al. |

FOREIGN PATENT DOCUMENTS

| JP | 64-47053 U | 3/1989 |
| JP | 4-71284 | 3/1992 |

(Continued)

OTHER PUBLICATIONS

International Search Report dated Sep. 3, 2013, in PCT/JP2013/064692, filed May 28, 2013.
(Continued)

*Primary Examiner* — Thiem Phan
(74) *Attorney, Agent, or Firm* — Oblon, McClelland, Maier & Neustadt, L.L.P.

(57) ABSTRACT

A metal core substrate is obtained as a result of outline shaping performed on a substrate including a core plate and an insulating layer provided on each of two surfaces of the core plate. An outer circumferential edge of the metal core substrate has an insulating structural portion, which includes an end surface of the core plate that is retracted from an end surface of the outer circumferential edge of the metal core substrate and an insulating covering portion covers the end surface of the core plate. Separation portions to be filled with the resin and coupling portions which are to be removed before outline shaping are formed at outline shaping positions of the core plate. At the time of outline shaping, only the resin is present at the outline shaping positions.

4 Claims, 10 Drawing Sheets

(51) Int. Cl.
  *H05K 1/05* (2006.01)
  *H05K 3/00* (2006.01)
(52) U.S. Cl.
  CPC ............... *H05K 2201/09145* (2013.01); *Y10T 29/49165* (2015.01)
(58) Field of Classification Search
  USPC ................. 29/852, 825, 829, 846, 847, 856
  See application file for complete search history.

(56) References Cited

FOREIGN PATENT DOCUMENTS

| | | |
|---|---|---|
| JP | 7-15137 | 1/1995 |
| JP | 8-307053 | 11/1996 |
| JP | 2004-311849 | * 11/2004 |
| JP | 2007-294932 | 11/2007 |
| JP | 2012-61480 | 3/2012 |
| WO | 2010/137475 A1 | 12/2010 |

OTHER PUBLICATIONS

Japanese Office Action dated Feb. 10, 2017 in Patent Application No. 2014-518446 (with English Translation).
International Search Report dated Sep. 3, 2013, in PCT/JP2013/064692 (English Translation Previously Filed).

* cited by examiner

METHOD FOR PRODUCING A METAL CORE SUBSTRATE HAVING IMPROVED EDGE INSULATING PROPERTIES

TECHNICAL FIELD

The present invention relates to a metal core substrate, and more specifically, to a metal core substrate having a high insulating property at end surface thereof.

BACKGROUND ART

Metal core substrates are produced as follows. On each of a top surface and a bottom surface of a core plate having predetermined holes, an insulating layer and a copper foil are sequentially stacked in this order from the inner side to form an integrated copper-lined stacking substrate. The copper-lined stacking substrate is put to a production line. In the production line, the copper-lined stacking substrate (work), for example, have through-holes formed therein, is plated and is patterned. As a result, a plurality of products are formed on one work (namely, a plurality of metal core substrates, namely, a plurality of metal core printed wiring boards each having a wiring pattern are formed on one copper-lined stacking substrate). Such products are separated from each other by outline shaping, and subjected to predetermined inspections and the like. Thus, production of the metal core substrates is finished.

Figure 8:
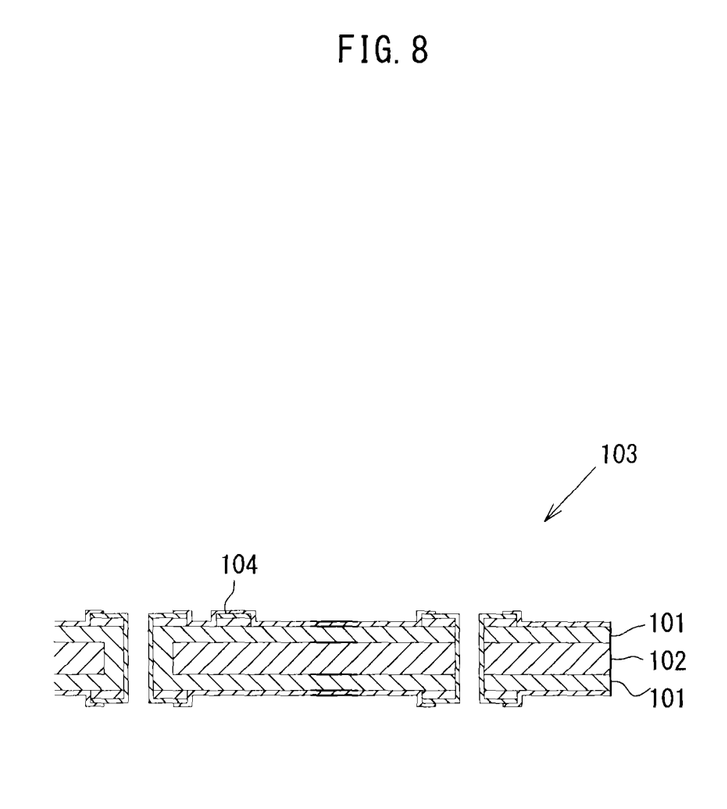
FIG. 8 is a cross-sectional view of an end portion of a conventional metal core substrate.

By outline shaping, the integrated plate including the stacked core plate and insulating layers is cut into the plurality of products. Therefore, as shown in FIG. 8, the insulating layers 101 and the core plate 102 included in each metal core substrate 103 are exposed along the entirety of an end surface of the metal core substrate 103.

Therefore, when the end surface is wetted by moisture, dew or the like, the insulating property between a wiring pattern 104 in a top layer of the metal core substrate 103 and the end surface of the core plate may possibly be deteriorated. In order to avoid this, especially when the inner layer is to be used as an electric wire, a measure against migration needs to be provided.

Outline shaping is performed to cut the core plate and thus has an inconvenience that burr or shear drop is caused. A reason for this is that outline shaping is commonly performed by die machining.

Another technique for outline shaping is routing. By routing, a drill-like circular bit including a blade on a side surface thereof cuts a member to be processed in a manner like tracing an end surface thereof. Therefore, routing has a disadvantage of being unable to perform a large amount of processing in a short time. By contrast, die machining, which is a method of punching out a member by use of a die and a punch, has an advantage of having a high productivity and thus is often used.

Figure 9:
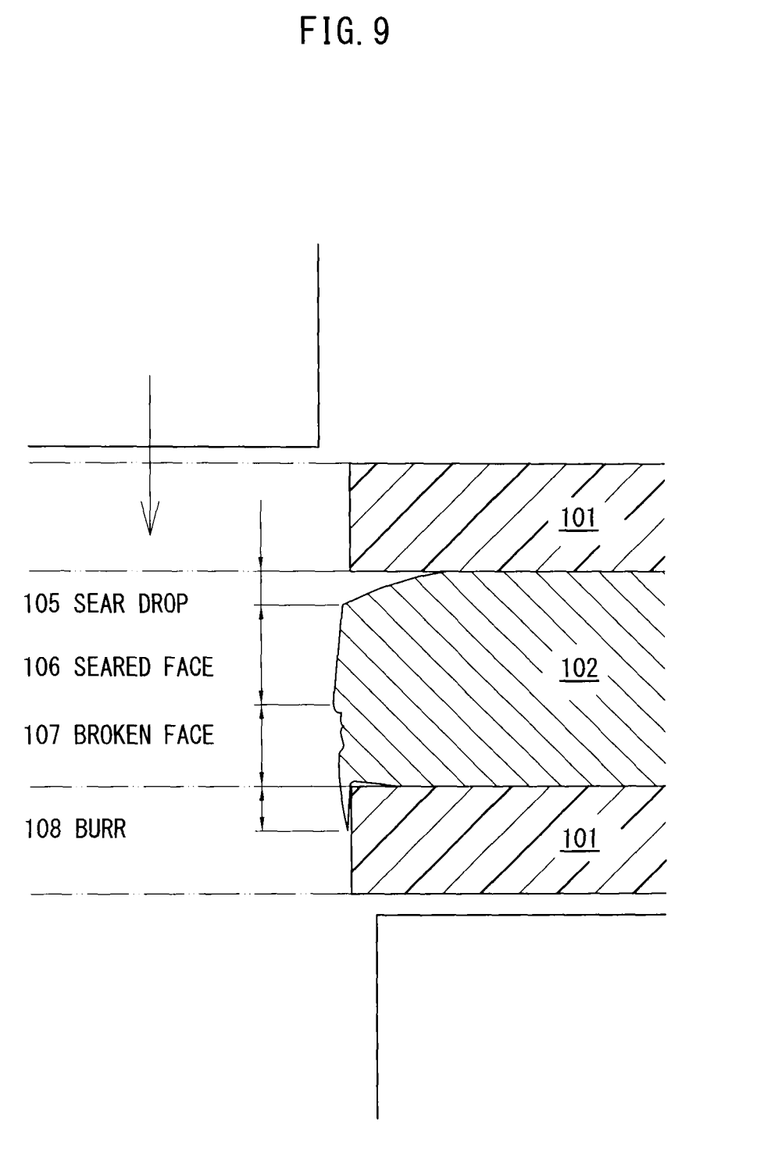
FIG. 9 shows an end portion of a conventional metal core substrate subjected to outline shaping by use of a die.

However, as shown in FIG. 9, an end surface of the metal core substrate processed by outline shaping, more specifically, die machining has shear drop 105, sheared face 106, broken face 107, and burr 108 although the degree thereof varies.

As the burr is larger, the insulating property is more deteriorated. When shear drop is caused, the core plate 102 and the insulating layer 101 are peeled from each other at the shear drop. When the core plate 102 and the insulating layer 101 are excessively peeled, delamination may be caused.

Patent Document 1 discloses a technique proposed to solve such inconveniences. According to this technique, before outline shaping is performed, a metal plate of a part that is to be subjected to outline shaping is removed by etching, so that only the resin part stacked on the metal plate is punched out. This is devised to prevent the quality of the post-processing product from lowering by burr. Since the metal plate is not punched out, burr or shear drop is not caused.

However, such a technique needs an increased number of steps and thus complicates the work, and in addition, cannot be used to produce a metal core substrate including a resin portion at each of two surfaces of the core plate.

Figure 10:
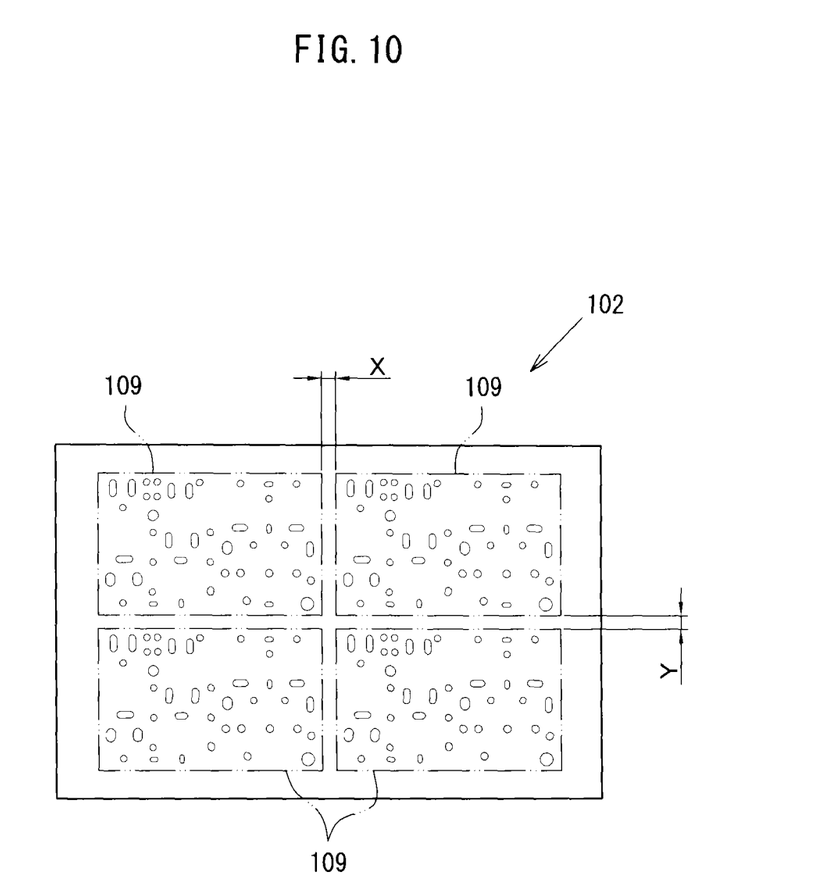
FIG. 10 is a plan view showing one problem of the conventional art.

Referring to FIG. 10, when die machining is used for outline shaping, relatively large processing margins X and Y need to be provided. FIG. 10 is a plan view of the core plate 102 in the case where four products, namely, four metal core substrates, are to be produced from one work. Rectangular parts enclosed by phantom lines (phantom outline shaping lines 109) are to be the metal core substrates. When die machining is used for outline shaping, the processing margins X and Y each need to have a size of about 5 mm. This may cause a problem of limiting the number of products which can be produced from one work.

CITATION LIST

Patent Literature

Patent Document 1: Japanese Laid-Open Patent Publication No. Hei 7-15137

SUMMARY OF INVENTION

Technical Problem

The present invention has an object of providing a simple structure that improves the insulating property of the end surface and prevents an inconvenience such as delamination or the like.

Solution to Problem

First means for achieving the object is a metal core substrate obtained as a result of outline shaping performed on a substrate including a core plate and an insulating layer provided on each of two surfaces of the core plate, wherein at least apart of an outer circumferential edge of the metal core substrate has an insulating structural portion, which includes an end surface of the core plate that is retracted from an end surface of the outer circumferential edge of the metal core substrate and an insulating covering portion that is formed of a resin used to form the insulating layers and covers the end surface of the core plate.

Second means for achieving the object is a method for producing a metal core substrate by stacking a core plate having holes therein and an insulating layer on each of two surfaces of the core plate to form an integral substrate and then performing outline shaping on the integral substrate to obtain the metal core substrate as being individually cut out; the method comprising a punching step of forming the holes in the core plate, wherein separation portions and coupling portions are alternately formed on phantom outline shaping lines along which outline shaping is to be performed in a later outline shaping step, each of the separation portions separating adjacent portions of the core plate to be metal core substrates from each other, or separating a portion of the core plate to be the metal core substrate from an outer peripheral portion of the core plate, along the phantom outline shaping line; and each of the coupling portions being astride the phantom outline shaping line(s) to couple the adjacent portions of the core plate to be the metal core substrates to each other or to couple the portion of the core plate to be the metal core substrate to the outer peripheral portion; a stacking step of performing the stacking, wherein the separation portions are filled with a resin used to form the insulating layers; a separation step, performed after the stacking step, of removing at least a part of each of the coupling portions by punching, so that the adjacent portions of the integral substrate to be the metal core substrates are separated from each other, or the portion of the integral substrate to be the metal core substrate is separated from the outer peripheral portion of the integral substrate, along the phantom outline shaping line; and an outline shaping step of performing the outline shaping along outline shaping positions to obtain the metal core substrate as being individually cut out; wherein an end surface of the core plate in the metal core substrate that defined the separation portions before the outline shaping step is covered with an insulating covering portion that is formed of a resin used to form the insulating layers.

According to the above, the insulating covering portion of the insulating structural portion along the outer circumferential edge prevents the end surface of the core plate from being exposed. Therefore, the insulating property of the end surface is higher than that of an exposed end surface of the core plate. In the insulating structural portion, the end surface of the core plate is not exposed outside. Therefore, shear drop, which would otherwise cause delamination in this portion, is not caused.

The separation portions and the coupling portions in the core plate can be formed merely by the punching step of forming holes in the core plate. The separation step of removing the coupling portions may be performed in a step of forming, for example, through-holes. Therefore, no additional step is needed.

Outline shaping may be performed by use of die machining like in the conventional art, or may be performed by use of any other technique.

In an embodiment of the present invention directed to the method for producing a metal core substrate, in the outline shaping step, notches may be formed at the outline shaping positions before performing the outline shaping.

According to this, the notches allows the outline shaping to be performed by a simple manner of, for example, bending. Therefore, no die is needed.

In an embodiment of the present invention directed to the method for producing a metal core substrate, the separation portions may extend linearly. In this case, the separation portions may each have a non-linear bending portion.

According to this, the separation portions extend linearly. This decreases the number of coupling portions to be removed later by punching. The bending portion of each separation portion suppresses the core plate from being curved or stressed.

Third means for achieving the object is a core plate on which an insulating layer is integrated to each of two surfaces thereof and which is to be subjected to outline shaping to produce a plurality of individually separated metal core substrates; wherein the core plate includes separation portions and coupling portions alternately formed on phantom outline shaping lines along which outline shaping is to be performed; each of the separation portions separates adjacent portions of the core plate to be metal core substrates from each other, or separates a portion of the core plate to be one of the metal core substrates from an outer peripheral portion of the core plate, along the phantom outline shaping line; each of the coupling portions is astride the phantom outline shaping line(s) to couple the adjacent portions of the core plate to be the metal core substrates to each other or to couple the portion of the core plate to be one of the metal core substrates to the outer peripheral portion of the core plate; and at least a part of each of the coupling portions is removed, so that the adjacent portions to be the metal core substrates are separated from each other, or the portion to be one of the metal core substrates is separated from the outer peripheral portion, along the phantom outline shaping line.

According to this, when the insulating layers are stacked on, and integrated with, the core plate, the separation portions are filled with the insulating layers. Therefore, it is merely needed to, after the coupling portions are removed to form a plurality of metal core substrates, to perform outline shaping along the phantom outline shaping lines on which the separation portions are formed. Thus, the above-described metal core substrates are individually cut out.

Fourth means for achieving the object is a method for producing a metal core substrate by stacking a core plate having holes therein and an insulating layer on each of two surfaces of the core plate to form an integral substrate and then performing outline shaping on the integral substrate to obtain the metal core substrate as being individually cut out; the method comprising a punching step of forming the holes in the core plate, wherein separation portions and coupling portions are alternately formed on phantom outline shaping lines along which outline shaping is to be performed in a later outline shaping step, each of the separation portions separating adjacent portions of the core plate to be metal core substrates from each other, or separating a portion of the core plate to be the metal core substrate from an outer peripheral portion of the core plate, along the phantom outline shaping line; and each of the coupling portions being astride the phantom outline shaping line(s) to couple the adjacent portions of the core plate to be the metal core substrates to each other or to couple the portion of the core plate to be the metal core substrate to the outer peripheral portion; a stacking step of performing the stacking, wherein the separation portions are filled with a resin used to form the insulating layers; a separation step, performed after the stacking step, of removing at least a part of each of the coupling portions by punching, so that the adjacent portions of the integral substrate to be the metal core substrates are separated from each other, or the portion of the integral substrate to be the metal core substrate is separated from the outer peripheral portion of the integral substrate, along the phantom outline shaping line; and an outline shaping step of performing the outline shaping along outline shaping positions to obtain the metal core substrate as being individually cut out; wherein an end surface of the core plate in the metal core substrate that defined the separation portions before the outline shaping step is covered with an insulating covering portion that is formed of a resin used to form the insulating layers; and at least one of the punching step and the outline shaping step is performed by use of fiber laser.

According to this, fiber laser is used in the method of the second means. Therefore, the processing can be performed at high speed, and the outline shaping can be performed with a desired shape of notches having an esthetically high appearance.

Advantageous Effects of Invention

According to the present invention, the level of exposure of the end surface of the core plate is decreased. Therefore, the end surface has a high insulating property. In addition, the core plate is not present in apart where outline shaping is performed. Therefore, shear drop, which would otherwise cause delamination, is prevented. For these reasons, a high performance metal core substrate is provided.

BRIEF DESCRIPTION OF DRAWINGS

FIG. 1(a) and FIG. 1(b) provide a cross-sectional view of an end portion of a metal core substrate and a plan view of the metal core substrate which omits a wiring pattern or the like.

FIG. 2(a) to FIG. 2(g) provide cross-sectional views showing a production process of the metal core substrate.

FIG. 5(e-1) and FIG. 5(g-1) provide cross-sectional views showing the production process of the metal core substrate.

FIG. 7(a) to FIG. 7(c) provide cross-sectional views each showing a part of the outline shaping step.

DESCRIPTION OF EMBODIMENTS

Figure 1A:
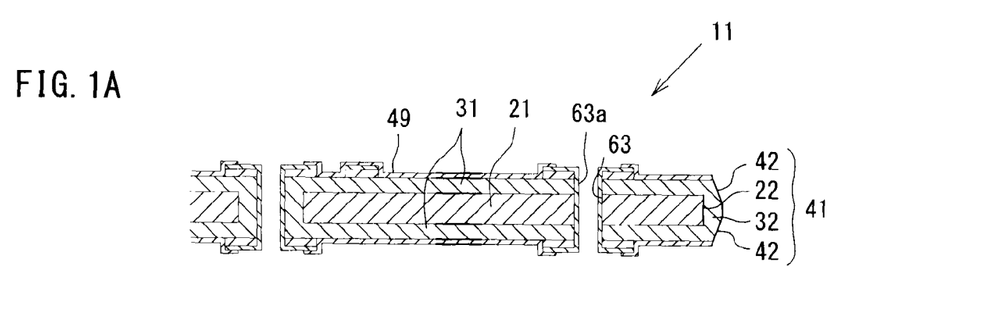
Figure 1B:
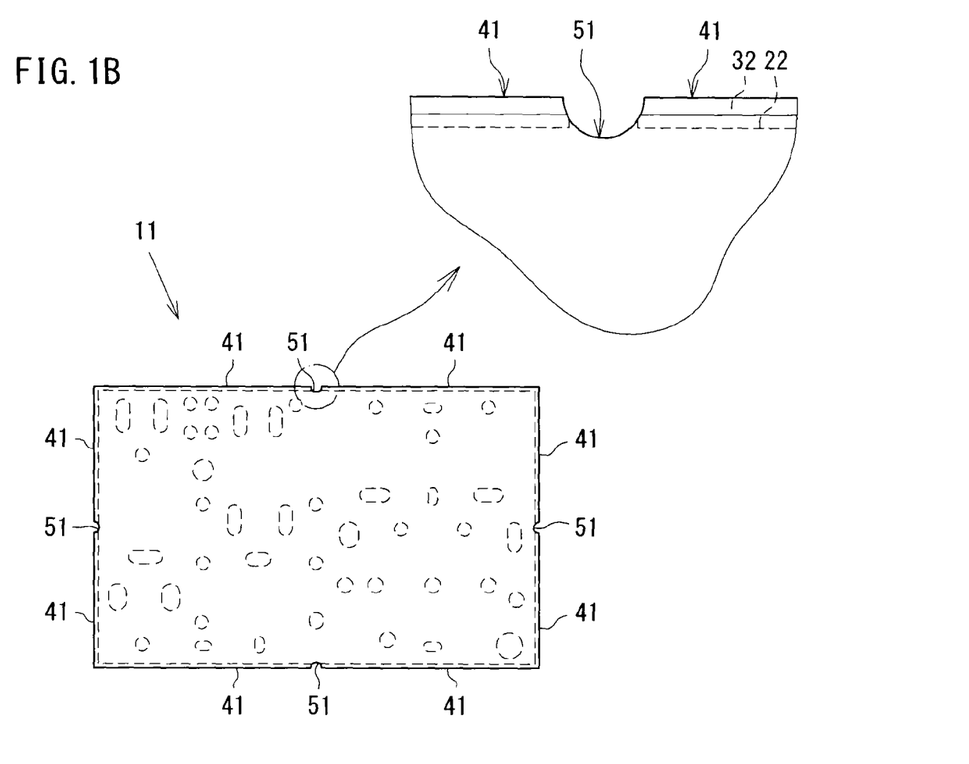

The present invention achieves the object of providing a simple structure that improves the insulating property of the end surface and prevents an inconvenience such as delamination or the like, by the following structure shown in FIG. 1(a) and FIG. 1(b). At least a part of an outer circumferential edge of a metal core substrate 11 individually cut out as a result of outline shaping has an insulating structure 41. The insulating structure 41 includes an end surface 22 of a core plate 21 that is retracted from an end surface of the outer circumferential edge and an insulating covering portion 32 that is formed of a resin used to form insulating layers 31 and covers the end surface 22 of the core plate 21.

In order to provide such a structure easily, the metal core substrate 11 is formed by a method including the following steps. In a punching step of forming holes in the core plate 21, separation portions 24 and coupling portions 27 are alternately formed on phantom outline shaping lines 26 along which outline shaping is to be performed in a later outline shaping step (see FIG. 3(a) and FIG. 3(b)). Each of the separation portions 24 separates adjacent portions of the core plate 21 to be metal core substrates 11 from each other, or separates a portion of the core plate 21 to be one metal core substrate 11 from an outer peripheral portion of the core plate 21, along the phantom outline shaping line 26. Each of the coupling portions 27 is provided between adjacent separation portions 24 and is astride the phantom outline shaping line(s) 26 to couple adjacent portions of the core plate 21 to be the metal core substrates 11 to each other or to couple a portion of the core plate 21 to be one metal core substrate 11 to the outer peripheral portion of the core plate 21. In a stacking step of stacking the core plate 21 and the insulating layers 31, the separation portions 24 are filled with the resin used to form the insulating layers 31. In a separation step performed after the stacking step, at least a part of each coupling portion 27 is removed by punching, so that the adjacent portions of the stack to be the metal core substrates 11 are separated from each other, or the portion of the stack to be one metal core substrate 11 is separated from the outer peripheral portion of the stack, along the phantom outline shaping line 26. In the outline shaping step, as shown in FIG. 6 and FIG. 7(a) to FIG. 7(c), outline shaping is performed along outline shaping positions to individually cut out the metal core substrates 11.

Hereinafter, an embodiment for carrying out the present invention will be described specifically with reference to the drawings.

FIG. 1(a) is a cross-sectional view of an end portion of the metal core substrate 11, and FIG. 1(b) is a plan view of the metal core substrate 11 which omits through-holes, a wiring pattern and the like for the sake of convenience. As shown in these figures, the metal core substrate 11 includes the conductive core plate 21 and the insulating layer 31 provided on each of two surfaces of the core plate 21 and formed of a synthetic resin. The metal core substrate 11 also includes the insulating structural portion 41 in at least a part of the outer circumferential edge, more specifically, along substantially the entirety of the outer circumferential edge. The insulating structural portion 41 includes the end surface 22 of the core plate 21 that is retracted from the end surface of the outer circumferential edge of the metal core substrate 11 and the insulating covering portion 32 that is formed of the resin used to form the insulating layers 31 and covers the end surface 22 of the core plate 21.

The distance by which the end surface 22 of the core plate 21 is retracted from the end surface of the outer circumferential edge, namely, a thickness t of the insulating covering portion 32 in an inner-outer direction thereof may have any size that provides electric insulation and is set to have an appropriate size.

An end surface of the insulating structural portion 41 has an inclining face 42 in each of an upper part and a lower part in a height direction thereof. Therefore, the insulating structural portion 41 has a cross-sectional shape which protrudes outward at a middle position from a top end and a bottom end thereof in the height direction.

In the figure, the insulating structural portion 41 is formed along the outer circumferential edge of the metal core substrate 11, which is rectangular as seen in a plan view, except for a middle point of each of four sides thereof.

Portions 51 of the outer circumferential edge of the metal core substrate 11 (middle points of the four sides) do not have the insulating structural portion 41. The core plate has been removed from portions 51 together with the insulating layers 31 by punching. At the portions 51, the metal core substrate 11 is recessed in a semi-arc shape as seen in a plan view. On such a semi-arcked curving circumferential surface of each portion 51, the end surface 22 of the core plate 21 and end surfaces of the insulating layers 31 are flush with each other. At around a center, in the curving direction, of the semi-arcked curving circumferential surface, the end surface 22 of the core plate 21 is partially exposed.

A process for producing the metal core substrate 11 will be described together with a detailed description of the core plate 21 and the like.

Figure 2A:
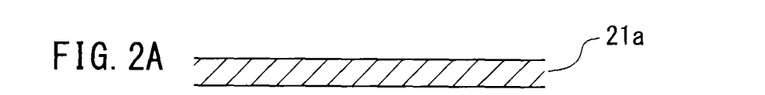

First, a substrate 21a, which is to be the core plate 21, is obtained by cutting a metal plate having a predetermined thickness. The substrate 21a is formed of a metal material such as copper, aluminum or the like (see FIG. 2(a)).

Next, the substrate 21a is punched at predetermined positions (punching step). In the punching step, holes 23 such as through-holes or the like that are necessary to produce the metal core substrates 11 are formed, and also pilot holes for necessary reference holes (not shown) and holes necessary to form the insulating structural portion 41, namely, holes necessary to form the separation portions 24 are formed (see FIG. 2(b)).

Figure 2B:
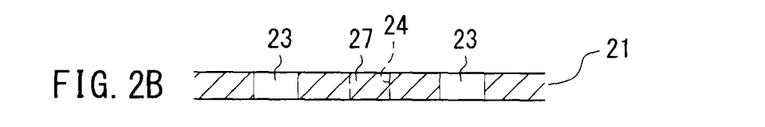

The holes 23 are appropriately formed in portions of the core plate 21 where the metal core substrates 11 are to be formed (hereinafter, such portions will be referred to as "product portions 25") in accordance with a desired wiring pattern or the like of the metal core substrates.

Figure 3A:
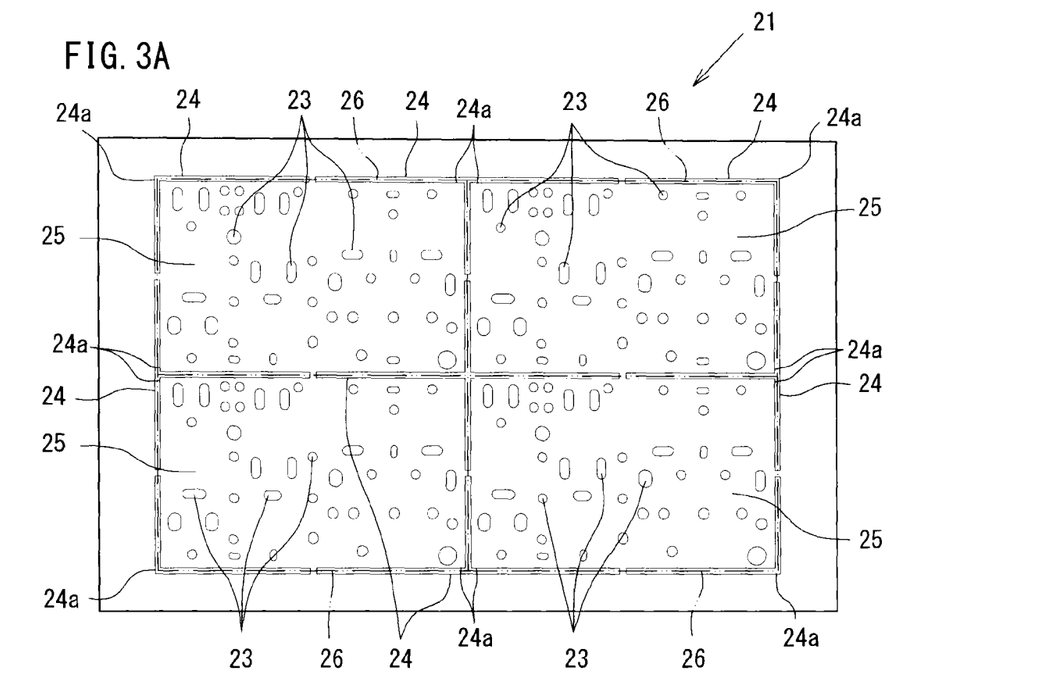
FIG. 3(a) and FIG. 3(b) provide provides plan views of a core plate.
Figure 3B:
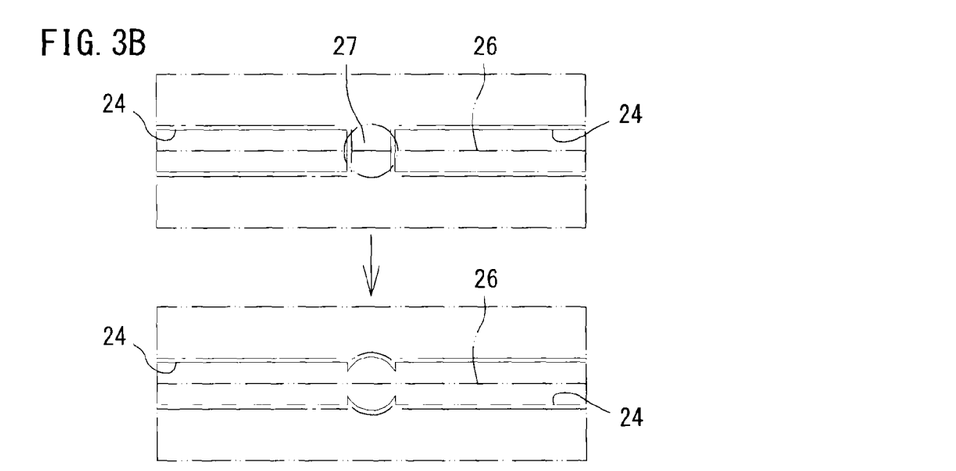

The separation portions 24 are formed at positions along which the metal core substrates 11 are to be individually cut out by outline shaping. This will be described more specifically. FIG. 3(a) is a plan view of the core plate 21. In FIG. 3(a), phantom outline shaping lines 26 enclosing the product portions 25 represent the positions along which the metal core substrates 11 are to be individually cut out by outline shaping. The separation portions 24 are formed on the phantom outline shaping lines 26.

The product portions 25 are each rectangular. FIG. 3(a) shows a case where four metal core substrates 11 are obtained from one core plate 21. Therefore, four product portions 25 are located in a 2×2 (length direction×width direction) arrangement while the phantom outline shaping lines 26 overlap each other.

The separation portions 24 are each formed of a through-hole which separates adjacent portions of the core plate 21 to be metal core substrates from each other, or separates a portion of the core plate 21 to be one metal core substrate from the outer peripheral portion of the core plate 21, along the phantom outline shaping line 26. The separation portions 24 each have a thin, lengthy linear shape. Each two adjacent separation portions 24 have a gap therebetween which can be filled with at least a resin.

Such a plurality of separation portions 24 are provided so as to have such gaps therebetween. The gap provided between each two adjacent separation portions 24 is a coupling portion 27 which is astride the phantom outline shaping line(s) 26 to couple adjacent portions to be the metal core substrates 11 to each other or couple a portion to be one metal core substrate 11 to the outer peripheral portion. At least a part of each coupling portion 27 is removed, so that the adjacent portions to be the metal core substrates 11 are separated from each other, or the portion to be one metal core substrate 11 is separated from the outer peripheral portion, along the phantom outline shaping line 26. The coupling portion 27 has a size sufficiently large to allow a hole to be formed therein so that the portions are separated along the phantom outline shaping line 26 (see FIG. 3(b)).

The plurality of such coupling portions 27 and the plurality of separation portions 24 are located alternately on the entirety of the phantom outline shaping lines 26.

This will be described more specifically. Each metal core substrate 11 has four sides. A total of four coupling portions 27 are respectively provided at middle positions of the phantom outline shaping lines 26 along the four sides. Between the coupling portions 27, the separation portions 24 each having an L-shape as seen in a plan view are provided. Thus, each separation portion 24 extends linearly but is not form one straight line. Each separation portion 24 has a bending portion 24a at a middle position in a longitudinal direction thereof, and the separation portion 24 is bent at the bending portion 24a at the right angle. The bending portion 24a increases the rigidity of planar portions facing each other while having the separation portion 24 therebetween, and thus suppresses such planar portions from being curved.

After the punching step, the core plate 21 having the holes is degreased, for example, is washed with water, and then is surface-roughened in order to have an increased adhesiveness with the resin.

Figure 2C:
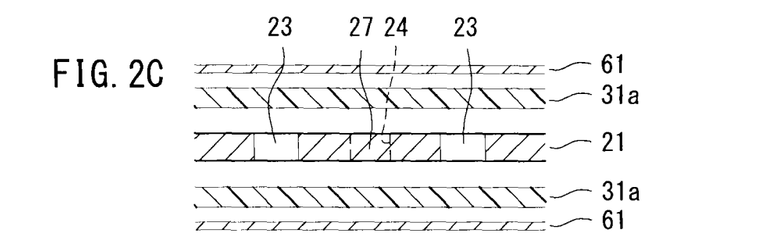

Next, a prepreg 31a and a copper foil 61 are sequentially stacked on each of two surfaces of the core plate 21 in this order from the inner side (see FIG. 2(c)). These layers are sandwiched between stainless steel plates (not shown) and heat-pressed to be integrated together (stacking step). As a result of the integration, all the holes of the core plate 21 including the separation portions 24 are filled with a resin used to form the prepregs 31a (see FIG. 2(d)).

Figure 2D:
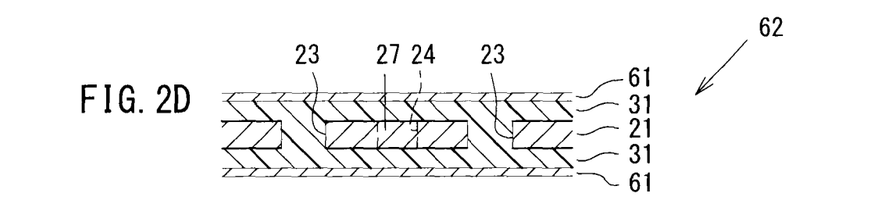

Such a stack formed as a result of the integration includes the copper foils 61 respectively provided on both of the two surfaces of the core plate 21, with insulating layers 31 formed of the prepregs 31a being sandwiched between the core plate 21 and the copper foils 61. Such an integrated stack is a copper-lined integrated plate 62.

Figure 2E:
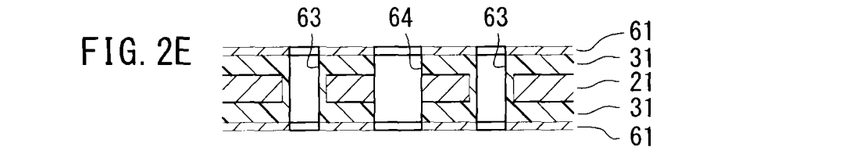

Next, as shown in FIG. 2(e), through-holes 63 are formed at predetermined positions (through-hole formation step). At the same time, holes are formed in the coupling portions 27 provided between the separation portions 24 (see FIG. 3(b)). Namely, a part of each of the coupling portions is removed to separate the adjacent portions of the copper-lined integrated plate 62 to be the metal core substrates 11 or to separate the portion of the copper-lined integrated plate 62 to be one metal core substrate 11 from the outer peripheral portion of the copper-lined integrated plate 62 (separation step).

Figure 4:
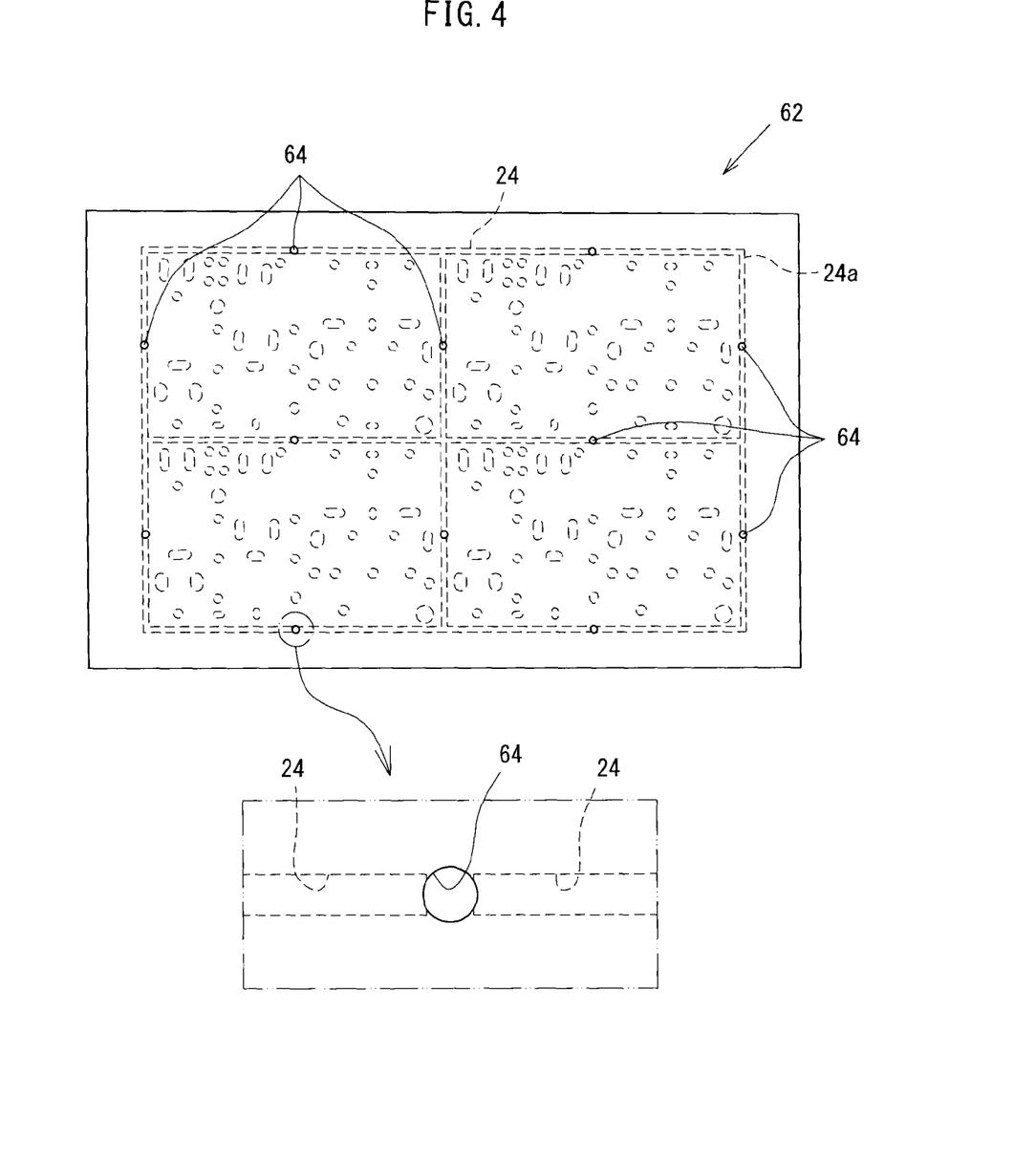
FIG. 4 provides plan views of a copper-lined stacking substrate after a separation step.

More specifically, as shown in FIG. 4, holes are formed by drilling at the predetermined positions of the copper-lined integrated plate 62 to form separation holes 64 having a size that is sufficiently large to perform the separation.

Figure 5E:
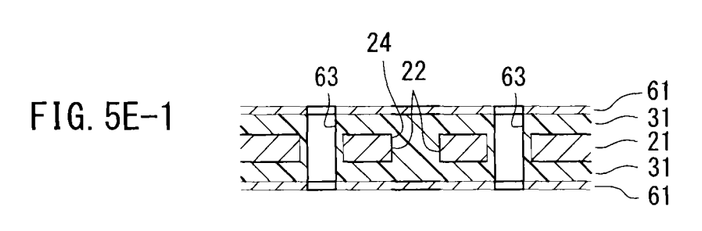

FIG. 2(e) is a cross-sectional view of apart including the coupling portion 27, and FIG. 5(e-1) is a cross-sectional view of a part including the separation portion 24 but not including the coupling portion 27. As can be seen from these figures, both in the part including the coupling portion 27 and the part not including the coupling portion 27, the core plate 21 is discontinuous between adjacent product portions 25 and also between each product portion 25 and the outer peripheral portion. The core plate 21 is not present on the phantom outline shaping lines 26.

Figure 2F:
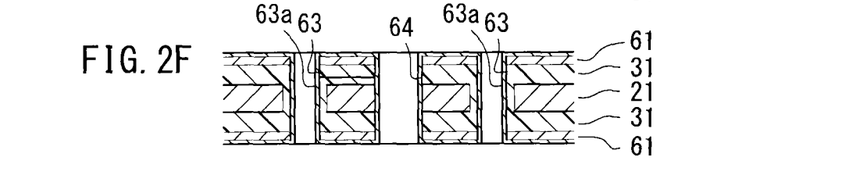

Next, the through-holes 63 are subjected to a necessary treatment, for example, desmeared, and then plated so that a conductive portion is formed on an inner circumferential surface of each through-hole 63 and the vicinity thereof (see FIG. 2(f)). The conductive portion provided on the inner circumferential surface of each through-holes 63 is a well-known through-hole plate 63a. The through-hole plate 63a and the core plate 21 are not in contact with each other.

Figure 2G:
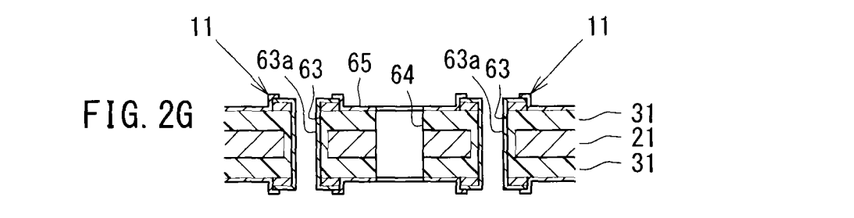
Figure 5G:
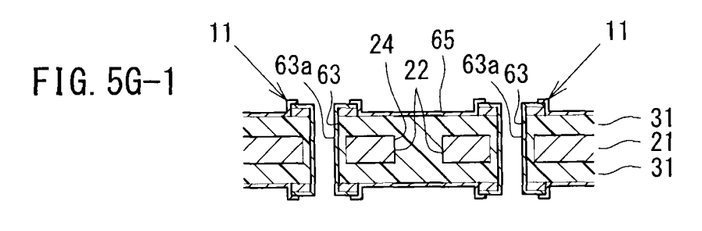

Then, necessary steps such as formation of a circuit pattern, formation of a solder resist 65 and the like are performed to provide metal core printed circuit boards (metal core substrates 11) (see FIG. 2(g) and FIG. 5(g-1)). FIG. 2(g) is a cross-sectional view of a part including the coupling portion 27 (see FIG. 2(e)), and FIG. 5(g-1) is a cross-sectional view of a part including the separation portion 24.

In a final step, outline shaping is performed along the separation portions 24, more specifically, along a center line of the separation portions 24 in a width direction (direction perpendicular to the longitudinal direction) to individually cut out the metal core substrates 11.

The formation of the holes may be performed by appropriate means as described above, but alternatively may be performed by use of laser or fiber laser.

Figure 6:
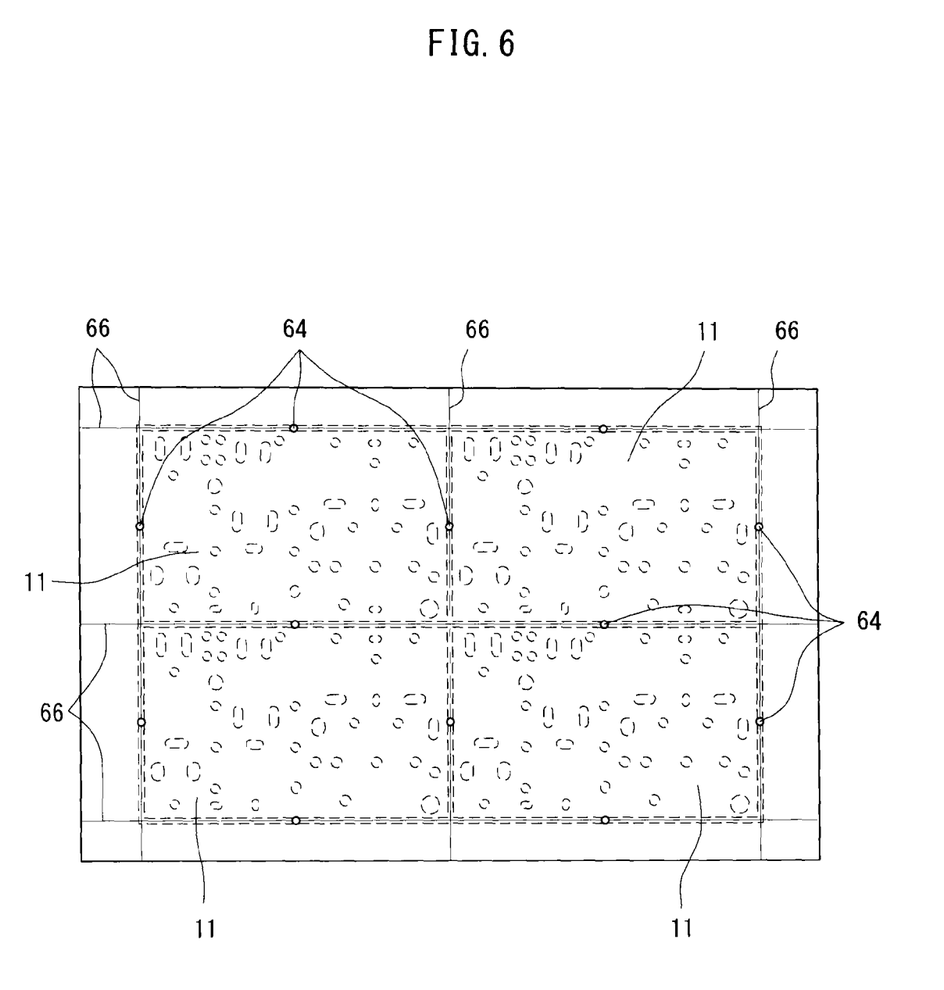
FIG. 6 is a plan view showing a part of an outline shaping step.
Figure 7A:
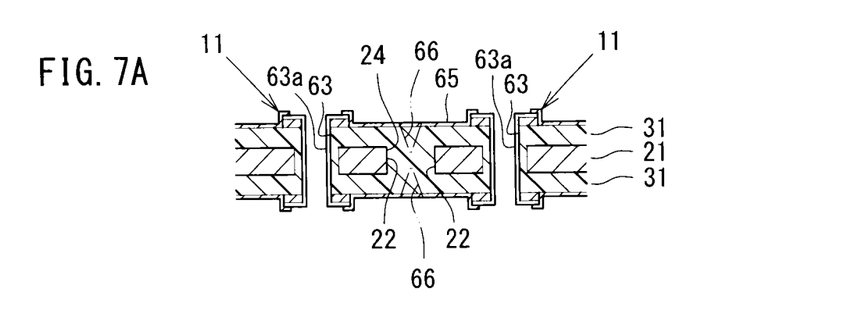

Outline shaping is performed as follows. As shown in FIG. 6, a plurality of notches 66 for cutting are formed along the entirety of the separation portions 24 and the coupling portions 27, namely, along the entirety of the positions along which outline shaping is to be performed. As shown in FIG. 7(a) by the phantom line, the notches 66 preferably have a V-shaped cross-sectional shape. Such a shape allows the copper-lined integrated plate 62 to be bent easily.

The notches 66 may be formed by use of, for example, a blade having a V-shaped cross-sectional shape. Alternatively, laser or fiber laser may be used. The notches 66 are formed at a top surface and a bottom surface of the copper-lined integrated plate 62. The notches 66 at the top surface and the notches 66 at the bottom surface may be formed at the same time or sequentially. Alternatively, the notches 66 may be formed only at the top surface or the bottom surface.

FIG. 6 omits the wiring pattern and the like for the sake of convenience.

Figure 7B:
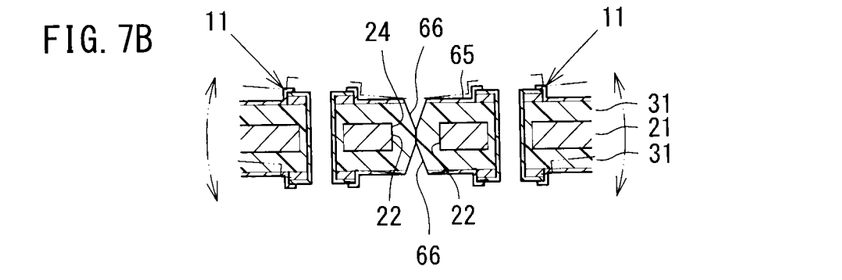
Figure 7C:
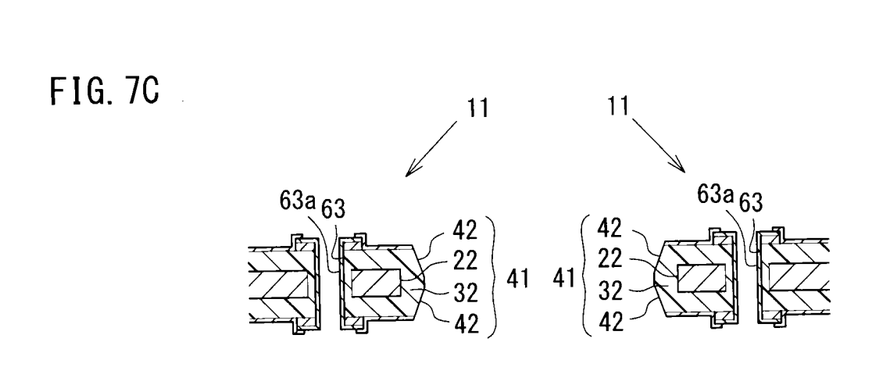

Referring to FIG. 7(b), in the state where the notches 66 are formed, adjacent metal core substrates 11, and each metal core substrate 11 and the peripheral portion, are merely connected to each other by the resin. Thus, the copper-lined integrated plate 62 merely needs to be bent as represented by the phantom lines in FIG. 7(b) in order to individually cut out the metal core substrates 11 as shown in FIG. 7(c). No die is necessary.

After being individually cut out, the metal core substrates 11 are subjected to an inspection or any other necessary step.

Each metal core substrate 11 produced in this manner has the end surface 22 of the core plate 21 covered with the insulating covering portion 32 and has a smaller number of coupling portions 27. Therefore, the end surfaces 22 of the core plate 21 are considered to be substantially non-exposed, and thus have a good insulating property. In addition, the insulating structural portion 41 has the inclining face 42 in each of the upper part and the lower part. Therefore, the creepage distance is longer than in the case where the end surface is vertical. For these reasons, the metal core substrate 11 has a high insulating property. In addition, even when the core plate 21 is used for an electric wire, no measure against migration is needed.

The core plate 21 is not present at the outline shaping positions. Therefore, burr or shear drop is not caused to the core plate 21. This can prevent delamination, which would be otherwise caused by the shear drop, and allows the outline shaping to be performed by a simple and low-cost method as described above with no need to use die machining (press).

Therefore, the phantom outline shaping lines 26 may be designed to be in contact with each other as described above, which allows the size of the processing margin to be minimized. This increases the yield and prevents defect of the solder resist 65 (cracks in the solder resist 65), which might be otherwise caused during the die machining.

Even in the case where the outline shaping to cut out the metal core substrates 11 is performed by pressing by use of a die, merely a small pressure is needed because the core plate 21 is not present at the outline shaping positions. This suppresses the solder resist from being cracked, and also allows low-cost equipment to be used and extends the life of the equipment.

The separation portions 24 each have the bending portion 24a. This increases the rigidity of planar portions facing each other while having the separation portion 24 therebetween, and thus suppresses such planar portions from being curved when being punched by use of a die or processed in any other manner. This provides an effect of decreasing defects or deficiencies.

The above-described structure is one embodiment for carrying out the present invention. The present invention is not limited to having the above-described structure. Any other structure may be used.

For example, the length or the shape of each separation portion of the core plate may be appropriately designed in accordance with the design of the substrate. The separation portions may be partially shorter.

The end surfaces of the separation portions in the longitudinal direction may be arced instead of being right-angled. In this case, when the coupling portions are drilled to form the holes, concentration of the stress to any particular part is more prevented than in the case where the end surfaces of the separation portions are right-angled. This has an advantage that, for example, the core plate or the insulating layers are prevented from being distorted.

The notches may have a U-shaped or I-shaped cross-sectional shape instead of the V-shaped cross-sectional shape.

REFERENCE SIGNS LIST

11 . . . Metal core substrate
21 . . . Core plate
22 . . . End surface
24 . . . Separation portion
24a . . . Bending portion
26 . . . Phantom outline shaping line
27 . . . Coupling portion
31 . . . Insulating layer
32 . . . Insulating covering portion
41 . . . Insulating structural portion
64 . . . Separation hole
66 . . . Notch

The invention claimed is:

1. A method for producing a metal core substrate by stacking a core plate having holes therein and an insulating layer on each of two surfaces of the core plate to form an integral substrate and then performing outline shaping on the integral substrate to obtain a plurality of metal core substrates on a same surface being individually cut out, the method comprising:

a punching step of forming the holes in the core plate, wherein separation portions and coupling portions are alternately formed on phantom outline shaping lines along which outline shaping is to be performed in an outline shaping step, a plurality of product portions to configure the metal core substrates are adjacently arranged in a matrix arrangement with the phantom outline shaping lines between each of the plurality of product portions, each of the separation portions separating adjacent portions of the core plate to be the metal core substrates from each other, or separating a portion of the core plate to be the metal core substrates from an outer peripheral portion of the core plate, along one of the phantom outline shaping lines, each of the separation portions in a plan view have a bending portion bent at a right angle at a middle position thereof, and one coupling portion is arranged on each side surrounding the respective product portions, each of the coupling portions have a size for accommodating a circular shape in the plan view to be formed to remove a part of each coupling portion so that the coupling portions can be separated along the phantom outline shaping lines, and each of the coupling portions are astride the phantom outline shaping lines to couple the adjacent portions of the core plate to be the metal core substrates to each other or to couple the portion of the core plate to be the metal core substrates to the outer peripheral portion;

a stacking step of performing the stacking, wherein the separation portions are filled with a resin used to form the insulating layers;

a separation step, performed after the stacking step, of removing the part of each of the coupling portions by punching using a drill or laser for forming the holes having the circular shape in the plan view, so that the adjacent portions of the integral substrate to be the metal core substrates are separated from each other, or the portion of the integral substrate to be the metal core substrates is separated from the outer peripheral portion of the integral substrate, along one of the phantom outline shaping lines, wherein the outline shaping step is to be performed in a state where the coupling portions are separated by the punching and the holes remain opened in the integral substrate; and the outline shaping step of performing the outline shaping along outline shaping positions to obtain the metal core substrates as being individually cut out by forming V-shaped linear notches on upper and lower surfaces of the outline shaping positions from one end to an opposite end of the integral substrate, wherein an insulating structural part including an insulating covering portion, which covers an end surface of the core plate in the metal core substrates that defined the separation portions before the outline shaping step and is formed of the resin used to form the insulating layers, and inclining faces configured of the surfaces defining the notches on upper and lower sides along a thickness direction of an end surface of the insulating structural part, are formed.

2. The method of claim 1, wherein the separation portions extend linearly.

3. The method of claim 1, wherein
in the punching step, end surfaces of the separation portions in a longitudinal direction are formed into an arc shape.

4. The method of claim 3, wherein
at least one of punching step and the outline shaping step is performed by use of a fiber laser.

* * * * *